United States Patent
Abe et al.

(10) Patent No.: US 9,695,514 B2
(45) Date of Patent: Jul. 4, 2017

(54) LAMINATED COATING HAVING EXCELLENT ABRASION RESISTANCE

(71) Applicant: KABUSHIKI KAISHA KOBE SEIKO SHO (KOBE STEEL, LTD.), Kobe-shi (JP)

(72) Inventors: Maiko Abe, Kobe-shi (JP); Kenji Yamamoto, Kobe (JP); Koichiro Akari, Buffalo Grove, IL (US)

(73) Assignee: Kobe Steel, Ltd., Kobe-shi (JP)

( * ) Notice: Subject to any disclaimer, the term of this patent is extended or adjusted under 35 U.S.C. 154(b) by 27 days.

(21) Appl. No.: 14/759,002

(22) PCT Filed: Jan. 24, 2014

(86) PCT No.: PCT/JP2014/051560
§ 371 (c)(1),
(2) Date: Jul. 2, 2015

(87) PCT Pub. No.: WO2014/115846
PCT Pub. Date: Jul. 31, 2014

(65) Prior Publication Data
US 2015/0361562 A1    Dec. 17, 2015

(30) Foreign Application Priority Data
Jan. 25, 2013 (JP) ................................. 2013-012636

(51) Int. Cl.
*B23B 27/14* (2006.01)
*C23C 28/04* (2006.01)
(Continued)

(52) U.S. Cl.
CPC ........ *C23C 28/044* (2013.01); *C23C 14/0641* (2013.01); *C23C 14/0647* (2013.01);
(Continued)

(58) Field of Classification Search
USPC .......... 51/307, 309; 428/216, 336, 697, 698, 428/699
See application file for complete search history.

(56) References Cited

U.S. PATENT DOCUMENTS 5,503,912 A * 4/1996 Setoyama ........... C03C 17/3435
428/699
5,700,551 A * 12/1997 Kukino ............... C04B 35/5831
428/698
(Continued)

FOREIGN PATENT DOCUMENTS

EP    1 382 709 A1    1/2004
JP    2004-42192 A    2/2004
(Continued)

OTHER PUBLICATIONS

Fox-Rabinovich et al "Self-adaptive wear behavior of nano-multilayered TiAlCrN/VN coatings under severe maching conditions" Surface & Coatings Tech 201 (2006) p. 1852-1860.*
(Continued)

*Primary Examiner* — Archene Turner
(74) *Attorney, Agent, or Firm* — Oblon, McClelland, Maier & Neustadt, L.L.P.

(57) ABSTRACT

A laminated coating film according to the present invention comprises at least one coating film (A) and at least one coating film (B) laminated on each other and has excellent abrasion resistance. [Coating film (A)] The compositional formula is $(M_{1-a}Si_a)(B_xC_yN_{1-x-y})$ (wherein M represents at least one element selected from the group consisting of a Group-4 element, a Group-5 element, a Group-6 element and Al; and a, x and y respectively represent the atomic ratios of Si, B and C), wherein a, x and y respectively fulfill the formulae: $0.05 \leq a \leq 0.35$, $0 \leq x \leq 0.15$ and $0 \leq y \leq 0.5$. [Coating film (B)] The compositional formula is $L(B_xC_yN_{1-x-y})$ (wherein L represents at least one element selected from the group consisting of W, Mo and V; and x and y respectively represent the atomic ratios of B and C), wherein x and y respectively fulfill the formulae: $0 \leq x \leq 0.15$ and $0 \leq y \leq 0.5$.

8 Claims, 1 Drawing Sheet

(51) Int. Cl.
  *C23C 14/06* (2006.01)
  *C23C 14/34* (2006.01)
  *C23C 28/00* (2006.01)
(52) U.S. Cl.
  CPC .......... *C23C 14/3464* (2013.01); *C23C 28/04* (2013.01); *C23C 28/042* (2013.01); *C23C 28/42* (2013.01)

(56) References Cited

U.S. PATENT DOCUMENTS 6,103,357 A * 8/2000 Selinder .............. C23C 14/0635
                                                          428/212
2004/0018393 A1   1/2004  Fukui et al.
2005/0170162 A1   8/2005  Yamamoto et al.
2008/0038503 A1   2/2008  Yamamoto

FOREIGN PATENT DOCUMENTS

| JP | 2005-256081 | * | 9/2005 |
| JP | 2011-93008 A | | 5/2011 |
| JP | 2011-93009 A | | 5/2011 |
| JP | 2011-183545 | * | 9/2011 |

OTHER PUBLICATIONS

International Search Report and Written Opinion issued Mar. 11, 2014 in PCT/JP2014/051560 filed Jan. 24, 2014.
Extended European Search Report issued on Jul. 25, 2016 in Patent Application No. 14743313.0.

* cited by examiner

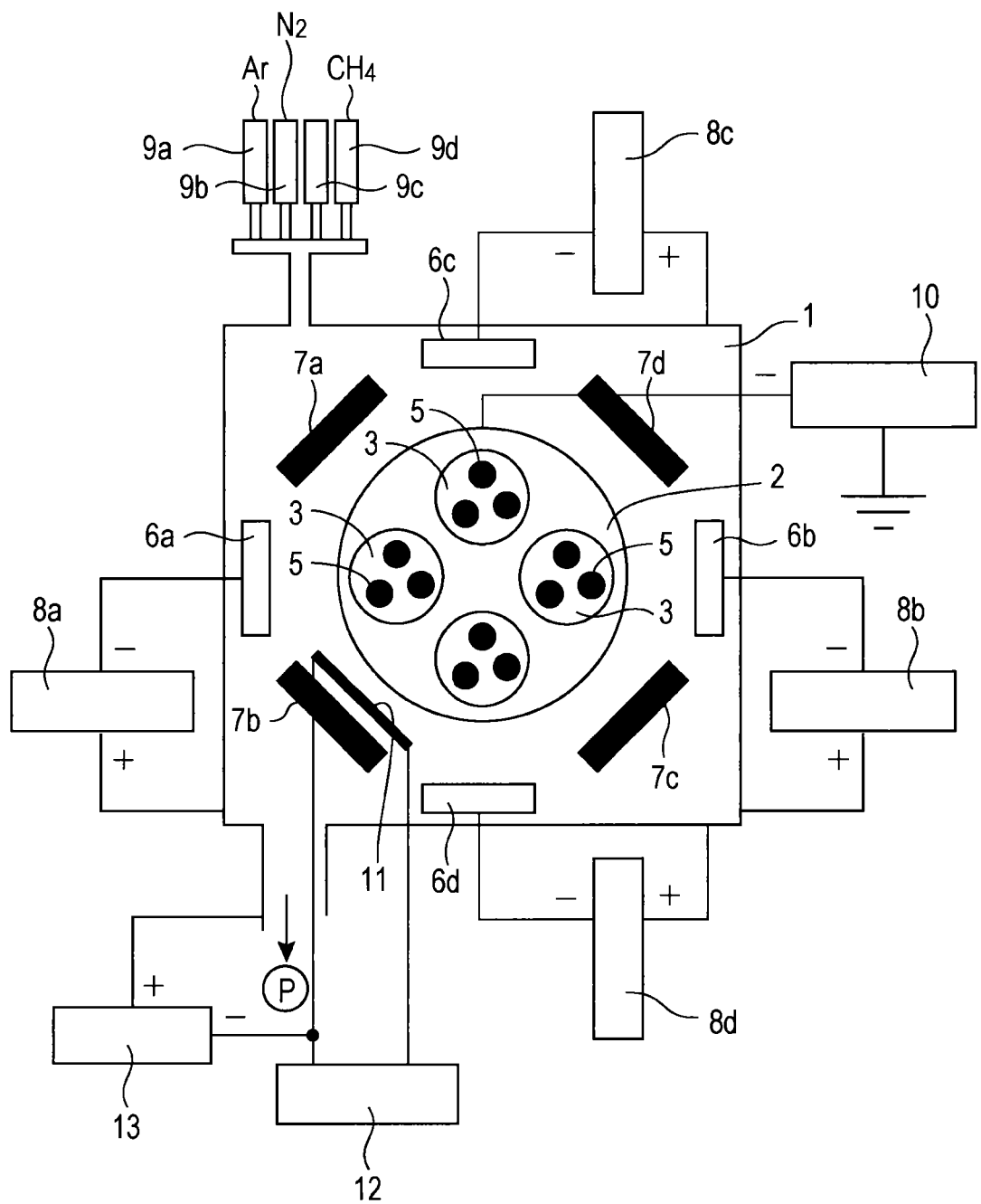

LAMINATED COATING HAVING EXCELLENT ABRASION RESISTANCE

TECHNICAL FIELD

The present invention relates to a laminated coating having excellent abrasion resistance. For example, the present invention relates to a laminated coating having excellent abrasion resistance formed on the surface of jigs and tools, such as a cutting tool and a die.

BACKGROUND ART

Heretofore, for the purpose of extending the life of jigs and tools, such as a cutting tool and a die, the surface of the jigs and tools has been coated with a hard coating of TiN, TiCN, TiAlN, or the like to increase the abrasion resistance.

In recent years, a coating having a laminated structure described in Patent Literatures 1 and 2, for example, has been proposed as a coating on the surface of a cutting tool. Specifically, Patent Literatures 1 and 2 disclose a laminated coating in which a coating A containing a solid solution of Mo and N, $Mo_2N$, MoN, or a mixture thereof and a coating B containing $Ti_{1-x-y}Al_xSi_yN$ are alternatively laminated to include two or more coatings A and two or more coatings B and the layer thickness of each of the coating A and the coating B, the layer thickness ratio of the coating A to the coating B, and the gradient structure of the layer thickness ratio in the cross section in the lamination direction of the coatings are defined. Moreover, in the laminated coating, the coating A has lubricity and deposition resistance and is effective for an improvement of machining quality of a material to be cut, an increase in speed, and a reduction in cutting edge temperature in dry processing and the coating B is excellent in the balance between abrasion resistance and toughness.

CITATION LIST

Patent Literature

PTL 1: Japanese Unexamined Patent Application Publication No. 2011-93008
PTL 2: Japanese Unexamined Patent Application Publication No. 2011-93009

SUMMARY OF INVENTION

Technical Problem

However, coatings in the related art do not have sufficient abrasion resistance. Thus, it is an object of the present invention to realize a laminated coating having excellent abrasion resistance which is formed on the surface of jigs and tools, such as a cutting tool and a die, for example, and can sufficiently increase the abrasion resistance of the cutting tool and the like.

Solution to Problem

The laminated coating having excellent abrasion resistance of the present invention which has been able to solve the above-described problems is a laminated coating to be formed on a substrate and has a feature in that one or more of each of a coating A and a coating B described below are laminated:

[Coating A]
A coating has a composition formula of $(M_{1-a}Si_a)(B_xC_yN_{1-x-y})$ (where M represents one or more elements selected from the group consisting of a group 4 element, a group 5 element, a group 6 element, and Al and a, x, and y represent the atomic ratios of Si, B, and C, respectively) and satisfies $0.05 \leq a \leq 0.35$, $0 \leq x \leq 0.15$, and $0 \leq y \leq 0.5$.

[Coating B]
A coating has a composition formula of $L(B_xC_yN_{1-x-y})$ (where L is one or more elements selected from the group consisting of W, Mo, and V, and x and y represent the atomic ratios of B and C, respectively) and satisfies $0 \leq x \leq 0.15$ and $0 \leq y \leq 0.5$.

In a preferable embodiment, M in the coating A represents one or more elements selected from the group consisting of Ti, Cr, Zr, Ta, and Al.

In a preferable embodiment, the thickness of each of the coating A and the coating B is 1.5 nm or more.

In a preferable embodiment, the thickness of each of the coating A and the coating B is 100 nm or less.

In a preferable embodiment, M in the coating A is Ti alone or a combination of Ti and Al (in which the amount of Al is 0.25 or less) and L in the coating B is V.

The present invention includes a cutting tool having a feature of including a substrate and the laminated coating covering the substrate.

Advantageous Effects of Invention

According to the present invention, a laminated coating having excellent abrasion resistance can be realized. When the laminated coating is formed on the surface of jigs and tools, such as a cutting tool and a die (particularly tools for use in drilling in a wet environment), the abrasion resistance of the cutting tool or the like can be improved and the extension of the life can be realized.

BRIEF DESCRIPTION OF DRAWINGS

FIG. 1 is a schematic explanatory view illustrating a configuration example of a forming device for producing a hard coating according to the present invention.

DESCRIPTION OF EMBODIMENTS

The present inventors have conducted extensive researches on a hard coating to be formed on the surface of jigs and tools, such as a cutting tool and a die, in order to solve the above-described problems. As a result, the present inventors have found that a laminated coating in which one or more of each of a coating A and a coating B described below are laminated demonstrates excellent abrasion resistance, and thus has completed the present invention. Hereinafter, the laminated coating of the present invention is described in detail.

[Coating A]
A coating has a composition formula of $(M_{1-a}Si_a)(B_xC_yN_{1-x-y})$ (where M represents one or more elements selected from the group consisting of a group 4 element, a group 5 element, a group 6 element, and Al and a, x, and y represent the atomic ratios of Si, B, and C, respectively, the same applies to the following) and satisfies $0.05 \leq a \leq 0.35$, $0 \leq x \leq 0.15$, and $0 \leq y \leq 0.5$.

[Coating B]
A coating has a composition formula of $L(B_xC_yN_{1-x-y})$ (where L is one or more elements selected from the group consisting of W, Mo, and V, and x and y represent the atomic ratios of B and C, respectively, the same applies to the following) and satisfies 0≤x≤0.15 and 0≤y≤0.5.

[Component Composition of Laminated Coating]

The laminated coating of the present invention has a feature in that the abrasion resistance has been able to be further improved than hard coatings in the related art by combining the coating A containing the above defined amount Si and showing high hardness and the coating B forming a lubricative oxide under sliding.

The coating A aims at an improvement of hardness due to particularly containing Si. In the present invention, in order to secure sufficient hardness, the lower limit of the amount of Si (a) is set to 0.05. The amount of Si is preferably 0.10 or more and more preferably 0.15 or more. On the other hand, when an excessive amount of Si is contained, the coating becomes amorphous, so that the hardness contrarily decreases. Therefore, the amount of Si is set to 0.35 or less. The amount of Si is preferably 0.30 or less and more preferably 0.25 or less.

M (hereinafter referred to as an "element M") constituting the coating A represents one or more elements selected from the group consisting of a group 4 element, a group 5 element, a group 6 element of the periodic table, and Al. As the element M, elements which are bonded to N to form nitride of high hardness are preferably used and, specifically, one or more elements selected from the group consisting of Ti, Cr, Zr, Ta, and Al are preferable. As a combination of a plurality of elements, combinations of Ti—Al and Ta—Al are preferable. As the element M, Ti alone or Ti—Al is more preferable among the above because the highest hardness is demonstrated. In the case where the element M is Ti—Al, when an excessive amount of Al is contained, the coating becomes amorphous, and thus the hardness decreases. Therefore, the upper limit (atomic ratio) of the amount of Al occupying (element M+Si) is preferably 0.25.

The coating A contains the Si and the nitride of the element M and may also contain a compound containing B and/or C. When containing B and C, the hardness can be further increased. In order to obtain such effect, when B is blended, the amount (x) of B is preferably 0.05 or more. However, when an excessive amount of B is contained, the hardness contrarily decreases. Therefore, the amount of B is set to 0.15 or less. The amount of B is preferably 0.10 or less. When C is blended, the amount (y) of C is preferably 0.15 or more and more preferably 0.20 or more. However, when an excessive amount of C is contained, the hardness contrarily decreases. Therefore, the amount of C is set to 0.5 or less. The amount of C is preferably 0.25 or less.

The coating B contains L (hereinafter referred to as an "element L") forming a lubricative oxide under sliding, and specifically contains one or more elements selected from the group consisting of W, Mo, and V. Among the above, V is preferable as the element L because V forms a lubricative oxide at the lowest temperature.

The coating B contains nitride of the element L and may also contain a compound containing B and/or C. When containing B and C, the hardness can be further increased. In order to obtain such effect, when B is blended, the amount (x) of B is preferably 0.05 or more. However, when an excessive amount of B is contained, the hardness contrarily decreases. Therefore, the amount of B is set to 0.15 or less. The amount of B is preferably 0.10 or less. When C is blended, the amount (y) of C is preferably 0.15 or more and more preferably 0.20 or more. When an excessive amount of C is contained, the hardness contrarily decreases. Therefore, the amount of C is set to 0.5 or less. The amount of C is preferably 0.25 or less.

A more preferable laminated coating is a laminated coating in which the element M in the coating A is Ti alone or the combination of Ti and Al (in this case, the amount of Al is 0.25 or less as described above) and the element L in the coating B is V.

[Thickness of Laminated Coating]

In order to demonstrate each function of the coating A and the coating B, each coating needs to have a thickness equal to or larger than a certain thickness and each coating needs to be present independently in the laminated state. Herein, "independently in the laminated state" refers to the state where each coating has a thickness equal to or larger than a certain thickness. This is because, when the thickness of each layer is thin in the formation of a multilayer coating, there is a tendency that the compositions of the coatings are mixed with each other, and therefore, unless the thickness is increased to some extent, a portion where the composition of each layer is fixed does not appear. The thickness of each of the coating A and the coating B is preferably set to 1.5 nm or more, more preferably 2 nm or more, still more preferably 5 nm or more, and particularly preferably 10 nm or more. When the total thickness of the laminated coating is 3 μm, a laminated coating of a two-layer structure of the coating A having a thickness of 1500 nm and the coating B having a thickness of 1500 nm can also be formed. However, in order to demonstrate an increase in hardness by the coating A and the effect of a lubricating coating obtained by the coating B to the maximum, it is preferable that the laminated coating has a structure in which two or more of each of the coating A and the coating B are alternatively laminated. From the viewpoint, the thickness of each of the coating A and the coating B is preferably 100 nm or less. The thickness is more preferably 50 nm or less and still more preferably 30 nm or less.

The thickness of the coating A and the thickness of the coating B do not necessarily need to be the same and the thicknesses of the coating A and the coating B may be varied according to the purpose. For example, the thickness of the coating A may be fixed (for example, 20 nm) and the thickness of the coating B may be varied between 2 to 50 nm. As described in Examples described later, in the case of cutting a material to be cut in which the cutting temperature becomes relatively high (for example, SCM440, SKD11, SACM, stainless steel, and the like), the thickness of the coating B is preferably set in the range of 3 nm or more (preferably 5 nm or more) and 15 nm or less (preferably 10 nm or less). On the other hand, in the case of cutting a material to be cut in which the cutting temperature is relatively low (for example, S50C and the like), the thickness of the coating B is preferably set in the range of 10 nm or more (preferably 15 nm or more) and 30 nm or less (preferably 25 nm or less).

When the total thickness (total thickness of the coating A and the coating B) of the laminated coating is excessively small, excellent abrasion resistance is hard to be demonstrated. Therefore, the total thickness is preferably 1 μm or more and more preferably 2 μm or more. On the other hand, when the thickness of the laminated coating is excessively large, loss or separation of the coating is likely to occur during cutting. Therefore, the total thickness is preferably 5 μm or less and more preferably 4 μm or less.

[Method for Forming Laminated Coating]

The present invention does not define a method for forming the laminated coating and the laminated coating can be produced using known methods, such as a physical vapor deposition method (PVD method) and a chemical vapor deposition method (CVD method). It is preferable to produce the laminated coating using the PVD method from the viewpoint of securing the adhesiveness with a substrate and the like. Specifically, a sputtering method, a vacuum deposition method, an ion plating method, and the like are mentioned.

As a method for forming the coating A, a method is mentioned which forms a coating by using, as an evaporation source (target), a target of a metal component (elements M and Si) composition constituting the coating A (target further containing B when forming the coating containing B) and using nitrogen gas or hydrocarbon gas (methane, acetylene, and the like) as an atmospheric gas (reactive gas). The coating may be formed using a target (nitride, carbonitride, carbide, carboboride, boride nitride, and carbonitride boride) containing a compound of the component composition constituting the coating A.

As a method for forming the coating B, the coating can be formed using, as an evaporation source (target), a target containing the element L (target further containing B when forming the coating containing B) and using nitrogen gas or hydrocarbon gas (methane, acetylene, and the like) as an atmospheric gas (reactive gas). The coating may be formed using a target (nitride, carbonitride, carbide, carboboride, boride nitride, and carbonitride boride) containing a compound of the component composition constituting the coating B.

When using the reactive gas (nitrogen gas or hydrocarbon gas), rare gas, such as Ar, Ne, and Xe, may be added for stabilizing discharge in addition to the reactive gas.

As a device for producing the laminated coating, a device having two arc evaporation sources can be used, for example, as illustrated in the FIGURE. The laminated coating is formed, using the coating device, by, for example, attaching the target for forming the coating A to one arc evaporation source (6a, 6b), attaching the target for forming the coating B to the other arc evaporation source, simultaneously causing both the evaporation sources to discharge, moving a substrate (a subject to be treated 5) to the front of the one arc evaporation source to form the coating B by a cathode discharge arc ion plating method (AIP method), moving the substrate (subject to be treated) to the front of the other arc evaporation source to form the coating A by the AIP method above, and then repeating such operation to laminate the coating A and the coating B.

The laminated coating can also be formed, by a sputtering method, by attaching the target for forming the coating A and the target for forming the coating B to two sputtering sources (6c, 6d) illustrated in the FIGURE above, respectively. Furthermore, as the formation method of the coating A and the coating B, one coating may be formed by an ion plating method and the other coating may be formed by a sputtering method, for example. In this case, the target for forming the coating to be formed by a sputtering method is attached to the sputtering source illustrated in the FIGURE and the target for forming the coating to be formed by an ion plating method is attached to the arc evaporation source illustrated in the FIGURE, for example.

Hereinafter, preferable coating conditions in the case of forming the coating A and the coating B by an ion plating method are described.

First, the temperature of the substrate (subject to be treated) in the formation may be selected as appropriate according to the type of the substrate. From the viewpoint of securing the adhesiveness of the substrate and the laminated coating, the temperature is preferably 300° C. or higher and more preferably 400° C. or higher. On the other hand, from the viewpoint of preventing deformation of the substrate and the like, it is recommended that the temperature of the substrate is preferably set to 800° C. or less and more preferably set to 700° C. or less.

A bias voltage to be applied to the substrate (subject to be treated) in the formation is suitably set in the range of 30 to 200 V (which is a negative bias voltage at which the substrate has a negative potential to the ground potential, the same applies to the following), when forming the coating using an AIP device. It is considered that, by applying a bias voltage to the substrate, ion bombardment to the substrate (subject to be treated) is effectively performed, so that the formation of a rock-salt structure is promoted. Accordingly, in order to demonstrate such an effect, the bias voltage is preferably set to 30 V or higher. However, when the bias voltage is excessively high, the coating is etched by ionized formation gas and the formation speed reduces extremely, and therefore it is preferable to set the bias voltage to 200 V or less.

Furthermore, in the present invention, the partial pressure or the total pressure of the reactive gas in the formation is preferably set in the range of 0.5 Pa to 7 Pa. In the case where the partial pressure or the total pressure is less than 0.5 Pa, a large number of macro particles (molten material of the target) are generated and the surface roughness increases, so that an inconvenience is caused depending on the intended use in the arc evaporation. Therefore, such a pressure is not preferable. The partial pressure or the total pressure is more preferably 1 Pa or more and still more preferably 1.5 Pa or more. On the other hand, when the partial pressure or the total pressure exceeds 7 Pa, scattering of the evaporation particles due to the collision with the reactive gas frequently occurs and the formation speed decreases. Therefore, such a pressure is not preferable. The partial pressure or the total pressure is more preferably 5 Pa or less and still more preferably 4 Pa or less.

The effect of the laminated coating of the present invention is sufficiently demonstrated by forming the laminated coating on the surface of jigs and tools. Examples of the jigs and tools include cutting tools, such as an insert, a drill, and an end mill, various dies for, such as forging, press forming, extrusion forming, and shearing, and jigs and tools, such as a blanking punch.

In particular, the laminated coating of the present invention is suitable for tools for use in cutting in a wet environment. Furthermore, in particular, the laminated coating of the present invention is suitable for a drill which is mainly used for wet treatment.

The substrate on which the laminated coating of the present invention is formed is determined as appropriate according to the type of the jigs and tools described above. Examples of the substrate include those formed with metal materials, such as various steel materials, for example, carbon steel for machine structure, alloy steel for structure, tool steel, and stainless steel, and hard metals. Moreover, those in which intermediate layers, such as a plating layer and a thermally sprayed layer, are formed on the surface of the metal materials are also included as examples of the substrate.

Between the substrate and the laminated coating of the present invention, an underlayer of TiAlN, TiN, CrN, or the like may be further formed.

EXAMPLES

Hereinafter, the present invention is described more specifically described with reference to Examples but it should not be construed that the invention is limited to the following Examples. The invention can also be practiced by applying modifications within a range adaptable to the purports described above and described below, and all of them are encompassed in the technical scope of the invention.

Example 1

In Example 1, various laminated coatings different in the compositions of the coating A and the coating B (the thickness of the coating A and the thickness of the coating B were fixed) were formed. Then, the influence of the compositions on abrasion resistance was examined.

Laminated coatings in which the coatings A and the coatings B of the compositions shown in Table 1 were alternatively laminated were formed with a PVD device in the FIGURE having a plurality of evaporation sources. The details are as follows.

As a substrate, a cutting tool (a double-edged carbide drill, φ8.5 mm, for a cutting test) was prepared. This substrate was subjected to ultrasonic degreasing washing in ethanol, and then introduced into the PVD (AIP) device. After evacuated to $5\times10^{-3}$ Pa, the substrate was heated to 500° C. Then, etching by Ar ions was carried out for 5 minutes. Subsequently, the laminated coating was formed on the substrate according to an AIP method.

The laminated coating was formed under the conditions where nitrogen gas was introduced to set the total pressure to 4 Pa, a discharge current of 150 A was supplied to arc evaporation sources (target 100 mm in diameter), the substrate temperature was set to 500° C., and the negative bias voltage was set to 30 V.

As the targets for forming the coating A and the coating B, targets containing the elements M and Si (further containing B when forming the coating containing B) of the compositions shown in Table 1 were used. Moreover, when forming a coating containing C, hydrocarbon gas was further used as an atmospheric gas.

In this Example, only arc evaporation sources (6a, 6b) were used among the plurality of evaporation sources in the device illustrated in the FIGURE. The target for forming the coating A was attached to one of the two arc evaporation sources (6a, 6b) in the device illustrated in the FIGURE, the target for forming the coating B is attached to the other one, only the target for forming the coating B was independently first discharged to form the coating B of about 100 nm, and then a substrate holder 2 was rotated while simultaneously discharging the target for forming the coating A and the target for forming the coating B, whereby a laminated coating in which the coating A and the coating B were alternatively laminated was formed.

In this Example 1, after the formation of the coating B of about 100 nm, the thickness of each of the coating A and the coating B (which refers to a thickness, unless otherwise particularly specified, a coating thickness or a thickness to be formed each time) was set to 20 nm and the number of times of lamination of the coating A and the coating B was set to 75 times, and then the laminated coating having a total thickness of about 3 μm was formed in any example.

The thickness and the number of times of lamination of each of the coating A and the coating B were controlled by adjusting the rotation speed and the number of rotations of a support stand.

As a comparative example, samples in which a TiAlN single layer (No. 26 in Table 1) and a TiN single layer (No. 27 in Table 1) were formed on the substrate were also prepared.

[Cutting Test]

Using the samples formed on the surface of the cutting tool described above, a cutting test was carried out under the following conditions to measure the abrasion amount on a boundary portion (abrasion amount of the outer circumferential surface) after passing a certain distance to evaluate the abrasion resistance. Specifically, the case where the abrasion amount of the outer circumferential surface was 69 μm or less was evaluated to be excellent in abrasion resistance. The abrasion amount is preferably 59 μm or less and more preferably 49 μm or less. These results are shown in Table 1.

[Cutting Test Conditions]
Material to be cut: S50C (raw material)
Cutting speed: 100 m/min
Sending: 0.24 mm/rotation
Hole depth: 23 mm
Lubrication: External oil supply, emulsion
Evaluation conditions: Abrasion amount of the outer circumferential surface after 1000 hole making

TABLE 1

| | | Composition of coating A (atomic ratio) | | | | | Composition of coating B (atomic ratio) | | | Abrasion amount of the outer circumferential surface |
|---|---|---|---|---|---|---|---|---|---|---|
| No. | M | Si | B | C | N | L | B | C | N | (μm) |
| 1 | Ti 0.99 | 0.01 | 0 | 0 | 1 | V 1.0 | 0 | 0 | 1 | 70 |
| 2 | Ti 0.95 | 0.05 | 0 | 0 | 1 | V 1.0 | 0 | 0 | 1 | 60 |
| 3 | Ti 0.9 | 0.1 | 0 | 0 | 1 | V 1.0 | 0 | 0 | 1 | 57 |
| 4 | Ti 0.85 | 0.15 | 0 | 0 | 1 | V 1.0 | 0 | 0 | 1 | 43 |
| 5 | Ti 0.8 | 0.2 | 0 | 0 | 1 | V 1.0 | 0 | 0 | 1 | 41 |
| 6 | Ti 0.7 | 0.3 | 0 | 0 | 1 | V 1.0 | 0 | 0 | 1 | 41 |
| 7 | Ti 0.65 | 0.35 | 0 | 0 | 1 | V 1.0 | 0 | 0 | 1 | 50 |
| 8 | Ti 0.6 | 0.4 | 0 | 0 | 1 | V 1.0 | 0 | 0 | 1 | 75 |
| 9 | Ti 0.8 | 0.2 | 0.1 | 0 | 0.9 | V 1.0 | 0 | 0 | 1 | 40 |
| 10 | Ti 0.8 | 0.2 | 0.15 | 0 | 0.85 | V 1.0 | 0 | 0 | 1 | 43 |
| 11 | Ti 0.8 | 0.2 | 0.2 | 0 | 0.8 | V 1.0 | 0 | 0 | 1 | 70 |
| 12 | Ti 0.8 | 0.2 | 0 | 0.25 | 0.75 | V 1.0 | 0 | 0 | 1 | 45 |
| 13 | Ti 0.8 | 0.2 | 0 | 0.5 | 0.5 | V 1.0 | 0 | 0 | 1 | 50 |
| 14 | Ti 0.8 | 0.2 | 0 | 0.6 | 0.4 | V 1.0 | 0 | 0 | 1 | 70 |
| 15 | Ti 0.8 | 0.2 | 0.1 | 0.25 | 0.65 | V 1.0 | 0 | 0 | 1 | 45 |
| 16 | Cr 0.8 | 0.2 | 0 | 0 | 1 | V 1.0 | 0 | 0 | 1 | 45 |
| 17 | Zr 0.8 | 0.2 | 0 | 0 | 1 | V 1.0 | 0 | 0 | 1 | 45 |
| 18 | Ta 0.8 | 0.2 | 0 | 0 | 1 | V 1.0 | 0 | 0 | 1 | 45 |

TABLE 1-continued

| No. | Composition of coating A (atomic ratio) | | | | | Composition of coating B (atomic ratio) | | | | Abrasion amount of the outer circumferential surface (μm) |
|---|---|---|---|---|---|---|---|---|---|---|
| | M | Si | B | C | N | L | B | C | N | |
| 19 | Ti 0.55 Al 0.25 | 0.2 | 0 | 0 | 1 | V 1.0 | 0 | 0 | 1 | 43 |
| 20 | Ti 0.8 | 0.2 | 0 | 0 | 1 | W 1.0 | 0 | 0 | 1 | 50 |
| 21 | Ti 0.8 | 0.2 | 0 | 0 | 1 | Mo 1.0 | 0 | 0 | 1 | 69 |
| 22 | Ti 0.8 | 0.2 | 0 | 0 | 1 | V 0.5 W 0.5 | 0 | 0 | 1 | 50 |
| 23 | Ti 0.8 | 0.2 | 0 | 0 | 1 | V 0.5 Mo 0.5 | 0 | 0 | 1 | 58 |
| 24 | Ti 0.8 | 0.2 | 0 | 0 | 1 | V 1.0 | 0.15 | 0 | 0.85 | 45 |
| 25 | Ti 0.8 | 0.2 | 0 | 0 | 1 | V 1.0 | 0 | 0.5 | 0.5 | 50 |
| 26 | Ti 0.5 Al 0.5 | 0 | 0 | 0 | 1 | 0 | 0 | 0 | 0 | 75 |
| 27 | Ti 1.0 | 0 | 0 | 0 | 1 | 0 | 0 | 0 | 0 | 90 |

As shown in Table 1, Nos. 2 to 7, 9, 10, 12, 13, and 15 to 25 had good abrasion resistance because the compositions of the coatings A and the coatings B satisfied the ranges defined in the present invention.

On the other hand, Nos. 1, 8, 11, 14, 26, and 27 had poor abrasion resistance because the compositions did not satisfy the ranges according to the present invention. A specific description is given below.

In No. 1, the amount of Si of the coating A was less than the lower limit. In No. 8, the amount of Si of the coating A exceeded the upper limit. In Nos. 11 and 14, the amount of B and the amount of C exceeded the upper limit, respectively. Nos. 26 and 27 are examples of the related art (comparative examples) in which a $Ti_{0.5}Al_{0.5}N$ single layer and a TiN single layer were formed, respectively. In all of these examples, the abrasion amount was large.

Example 2

In Example 2, coatings were formed in which the coating compositions of the coating A and the coating B were fixed and the thickness of each of the coatings A and the coatings B was varied in each sample. Then, the influence of the thickness of the coating A and the thickness of the coating B on cutting performance was examined.

Samples were produced in the same manner as in Example 1, except that the composition of each coating A was fixed to $Ti_{0.8}Si_{0.2}N$ and the composition of each coating B was fixed to VN and the thickness and the number of times of lamination of each of the coating A and the coating B were changed in each sample as shown in Table 2.

Then, a cutting test was carried out in the same manner as in Example 1. The results are shown in Table 2.

TABLE 2

| No. | Thickness of coating A (nm) | Thickness of coating B (nm) | Number of times of lamination (times) | Abrasion amount of the outer circumferential surface (μm) |
|---|---|---|---|---|
| 1 | 1.5 | 1.5 | 1000 | 60 |
| 2 | 2 | 2 | 750 | 55 |
| 3 | 10 | 10 | 150 | 45 |
| 4 | 20 | 20 | 75 | 41 |
| 5 | 50 | 50 | 30 | 42 |
| 6 | 100 | 100 | 15 | 53 |
| 7 | 200 | 200 | 8 | 58 |

TABLE 2-continued

| No. | Thickness of coating A (nm) | Thickness of coating B (nm) | Number of times of lamination (times) | Abrasion amount of the outer circumferential surface (μm) |
|---|---|---|---|---|
| 8 | 1500 | 1500 | 1 | 62 |

Table 2 shows the following facts. Nos. 1 to 8 are within the range of Claims and Nos. 2 to 6 are in preferable ranges. Nos. 1 to 8 in which the coatings A and the coatings B in the defined ranges were laminated had good abrasion resistance. Among the above, Nos. 2 to 6 in which the thickness of the coating A and the thickness of the coating B were in preferable ranges had better abrasion resistance. In Nos. 3 to 5 in which the thickness of the coating A and the thickness of the coating B are in more preferable ranges, much better abrasion resistance was obtained.

Example 3

In Example 3, coatings were formed in which the coating compositions of the coating A and the coating B and the thickness of the coating A were fixed and the thickness of each of the coatings B was varied in each sample. Then, the influence of the thickness of the coating B on cutting performance was examined.

Samples were produced in the same manner as in Example 2, except that coatings were formed in which the thickness of the coating A was fixed and the thickness of each of the coatings B was varied in each sample as shown in Table 3 and a test using a material to be cut SCM440 described below was also carried out as a cutting test. In Example 3, the abrasion resistance was evaluated as follows. More specifically, when the material to be cut was S50C, the case where the abrasion amount of the outer circumferential surface was 69 μm or less was evaluated to be excellent in abrasion resistance. The abrasion resistance is preferably 59 μm or less and more preferably 49 μm or less. When the material to be cut was SCM440, the case where the abrasion amount of the outer circumferential surface was 70 μm or less was evaluated to be excellent in abrasion resistance. The abrasion resistance is preferably 60 μm or less and more preferably 55 μm or less.

[Cutting Test Conditions (in the Case where the Material to be Cut was SCM440)]
Material to be cut: SCM440 (raw material)
Cutting speed: 75 m/min
Sending: 0.24 mm/rotation
Hole depth: 23 mm
Lubrication: External oil supply, emulsion
Evaluation conditions: Abrasion amount of the outer circumferential surface after 1000 hole making

TABLE 3

| No. | Thickness of coating A (nm) | Thickness of coating B (nm) | Abrasion amount of the outer circumferential surface (μm) Material to be cut: S50C | Abrasion amount of the outer circumferential surface (μm) Material to be cut: SCM440 |
|---|---|---|---|---|
| 1 | 20 | 2 | 60 | 58 |
| 2 | 20 | 5 | 52 | 55 |
| 3 | 20 | 20 | 41 | 60 |
| 4 | 20 | 50 | 55 | 70 |

As shown in Table 3, Nos. 1 to 4 had good abrasion resistance because the thickness of each of the coating A and the coating B satisfied the ranges of the present invention.

Among the above, in the cutting test using the material to be cut SCM440 in which the cutting temperature increases, No. 2 showed the best abrasion resistance and, in the cutting test using the material to be cut S50C in which cutting temperature is relatively low, No. 3 showed the best abrasion resistance. These results show that an appropriate thickness of the coating B having a lubrication effect varies according to the type of the material to be cut in the cutting test. In detail, when cutting S50C in which the cutting temperature is relatively low, the abrasion amount was the smallest when the thickness of the coating B was about 20 nm. On the other hand, when cutting SCM440 in which the cutting temperature increases, the lubrication effect obtained by the coating B was low and the abrasion due to oxidation of the coating B progressed when the thickness of the coating B is about 20 nm. Therefore, it is considered that when the thickness of the coating B is smaller, about 5 nm, the lowest abrasion value is shown.

Example 4

In Example 4 the cutting performance is examined when forming an underlayer (coating other than coating A and the coating B) between the laminated coating of the present invention and the substrate.

Samples were produced in the same manner as in Example 1, except that the composition of the coating A was set to $(Ti_{0.8}Si_{0.2})N$, the composition of the coating B was set to VN, and $(Ti_{0.5}Al_{0.5})N$ was formed as an underlayer between the substrate and the laminated coating.

Then, a cutting test was carried out in the same manner as in Example 1. As a result, the abrasion amount of the outer circumferential surface was 50 μm. This shows that, in the samples, the compositions of the coatings A and the coatings B satisfy the ranges defined in the present invention, and therefore, even in the case where a coating other than coating A and the coating B was formed as an underlayer, the abrasion resistance is good.

The present invention is described in detail and with reference to the specific embodiment but it is obvious for persons skilled in the art that various alternations and modifications can be applied without deviating from the spirit and the scope of the present invention.

This application is based on Japanese Patent Application (Japanese Patent Application No. 2013-012636) filed on Jan. 25, 2013, and the contents are incorporated herein as reference.

INDUSTRIAL APPLICABILITY

The laminated coating of the present invention is suitable as a coating material for jigs and tools, such as a cutting tool and a die, for example, and gives excellent abrasion resistance.

REFERENCE SIGNS LIST

1 Vacuum chamber
2 Substrate holder (Rotary board)
3 Substrate table
5 Subject to be treated (Substrate)
6a, 6b Arc evaporation source
6c, 6d Sputtering source
7a, 7b, 7c, 7d Heater
8a, 8b Arc power supply
8c, 8d Sputtering power source
9a, 9b, 9c, 9d Mass flow controller
10 Bias power supply
11 Filament type ion source
12 Alternating-current power supply for filament heating
13 Direct-current power supply for discharging

The invention claimed is:

1. A laminated coating, comprising:
a coating A, and
a coating B,
wherein
one or more of each of the coating A and the coating B are laminated,
the coating A is a coating having a composition formula of $(M_{1-a}Si_a)(B_xC_yN_{1-x-y})$, where M represents one or more elements selected from the group consisting of Ti, Zr, and Ta, and a, x, and y represent the atomic ratios of Si, B, and C, respectively) and satisfy:
$0.05 \leq a \leq 0.35$,
$0 \leq x \leq 0.15$, and
$0 \leq y \leq 0.5$, and
the coating B is a coating having a composition formula of $L(B_xC_yN_{1-x-y})$, where L is one or more elements selected from the group consisting of W, Mo, and V, and x and y represent the atomic ratios of B and C, respectively and satisfy:
$0 \leq x \leq 0.15$, and
$0 \leq y \leq 0.5$.

2. The laminated coating according to claim 1, wherein M in the coating A represents Ti.

3. The laminated coating according to claim 1, wherein a thickness of each of the coating A and the coating B is 1.5 nm or more.

4. The laminated coating according to claim 1, wherein a thickness of each of the coating A and the coating B is 100 nm or less.

5. The laminated coating according to claim 1, wherein M in the coating A is Ti alone and
L in the coating B is V.

6. A cutting tool, comprising:
a substrate; and
the laminated coating according to claim 1 covering the substrate.

7. The laminated coating according to claim 1, wherein M in the coating A represents Zr.

8. The laminated coating according to claim 1, wherein M in the coating A represents Ta.

\* \* \* \* \*